United States Patent
Liu (10) Patent No.: US 12,550,415 B2
(45) Date of Patent: Feb. 10, 2026

(54) SEMICONDUCTOR STRUCTURE AND METHOD FOR FABRICATING SAME

(71) Applicant: CHANGXIN MEMORY TECHNOLOGIES, INC., Hefei (CN)

(72) Inventor: Yang Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 506 days.

(21) Appl. No.: 18/151,458

(22) Filed: Jan. 8, 2023

(65) Prior Publication Data
US 2024/0055302 A1 Feb. 15, 2024

(30) Foreign Application Priority Data
Aug. 12, 2022 (CN) .......................... 202210970495.5

(51) Int. Cl.
H10D 84/03 (2025.01)
H01L 21/28 (2025.01)
(Continued)

(52) U.S. Cl.
CPC ..... *H10D 84/038* (2025.01); *H01L 21/28088* (2013.01); *H10D 64/667* (2025.01); *H10D 84/0177* (2025.01); *H10D 84/85* (2025.01)

(58) Field of Classification Search
CPC ........... H10D 84/0172; H10D 84/0177; H10D 84/0181; H10D 64/667–669;
(Continued)

(56) References Cited

U.S. PATENT DOCUMENTS 10,505,007 B1 * 12/2019 Su ....................... H10D 84/0142
2003/0009866 A1 * 1/2003 Kashihara ......... H01L 21/76802
29/25.42
(Continued)

FOREIGN PATENT DOCUMENTS

CN 110800113 A 2/2020

OTHER PUBLICATIONS

Modern VLSI Design: System-on-chip Design, Chapter 2: Transistors and Layout, Wolf. (Year: 2002).*
(Continued)

*Primary Examiner* — Julio J Maldonado
*Assistant Examiner* — Eric Manuel Mulero Flores
(74) *Attorney, Agent, or Firm* — Kilpatrick Townsend & Stockton LLP (57) ABSTRACT

Embodiments provide a semiconductor structure and a fabricating method. The method includes: providing a substrate including a first type region and a second type region; a first insulation layer and a first initial gate structure being provided on the substrate of the first type region, and a second insulation layer and a second initial gate structure being provided on the substrate of the second type region; and simultaneously etching the first initial gate structure and the second initial gate structure multiple times to form a first gate structure and a second gate structure, an orthographic projection of a bottom of the first gate structure on the substrate being positioned in an orthographic projection of a top of the first gate structure on the substrate, where after a first etching process, a top surface of the first insulation layer positioned in the first type region is not exposed to outside.

10 Claims, 3 Drawing Sheets

(51) Int. Cl.
*H10D 64/66* (2025.01)
*H10D 84/01* (2025.01)
*H10D 84/85* (2025.01)

(58) Field of Classification Search
CPC ............... H10D 84/0135; H10D 84/14; H01L 21/02019; H01L 21/30604; H01L 21/30608; H01L 21/312331; H01L 21/32134; H01L 21/28044; H01L 21/28066; H01L 21/31111; H01L 21/32133–32135; H01L 21/7685; H01L 21/30606; C23F 1/14–30; C23F 1/26
See application file for complete search history.

(56) References Cited

U.S. PATENT DOCUMENTS

| | | | | |
|---|---|---|---|---|
| 2005/0101113 A1* | 5/2005 | Brask | ............... | H01L 21/28079 |
| | | | | 257/E21.309 |
| 2007/0178634 A1* | 8/2007 | Jung | ............... | H10D 64/667 |
| | | | | 257/E21.639 |
| 2008/0176371 A1* | 7/2008 | Rao | ............... | H10D 64/035 |
| | | | | 438/257 |
| 2009/0108370 A1* | 4/2009 | Tsukamoto | ............... | H10D 84/0181 |
| | | | | 257/E21.632 |
| 2013/0264632 A1* | 10/2013 | Ding | ............... | H10D 30/031 |
| | | | | 438/151 |
| 2013/0341710 A1* | 12/2013 | Choi | ............... | H01L 21/76841 |
| | | | | 257/330 |
| 2014/0014942 A1* | 1/2014 | O'Neill | ............... | H10D 30/6729 |
| | | | | 257/43 |
| 2014/0239405 A1* | 8/2014 | Ha | ............... | H10D 64/691 |
| | | | | 257/411 |
| 2017/0229461 A1* | 8/2017 | Liao | ............... | H10D 84/83 |
| 2017/0229468 A1* | 8/2017 | Yang | ............... | H10D 30/62 |

OTHER PUBLICATIONS

Piranha Solutions, Princeton University, https://ehs.princeton.edu/book/export/html/513 (Year: 2025).*

Wet Etching, The University of Michigan Lurie Nanofabrication Facility (Year: 2020).*

* cited by examiner

SEMICONDUCTOR STRUCTURE AND METHOD FOR FABRICATING SAME

CROSS REFERENCE TO RELATED APPLICATION

This application claims priority to Chinese Patent Application No. 202210970495.5, titled "SEMICONDUCTOR STRUCTURE AND METHOD FOR FABRICATING SAME" and filed to the State Patent Intellectual Property Office on Aug. 12, 2022, the entire contents of which are incorporated herein by reference.

TECHNICAL FIELD

Embodiments of the present disclosure relate to the field of semiconductors, and more particularly, to a semiconductor structure and a method for fabricating the same.

BACKGROUND

With the development of CMOS technologies, traditional silicon dioxide gate dielectrics and polycrystalline silicon transistors have reached physical limits. For example, a problem of an excessively high leakage current caused by a quantum tunneling effect and a problem of depletion of the polycrystalline silicon have serious adverse effects on performance of semiconductor devices. Starting from a 45 nm technology node, a thickness of a silicon dioxide gate dielectric layer has been reduced to less than 2 nm. To improve a gate leakage current, in the semiconductor industry, silicon dioxide is replaced with high-K dielectric materials $HfO_2$ and HfSiON as a gate dielectric. A process of replacing a conventional silicon dioxide gate dielectric with a high-K dielectric material and replacing a polycrystalline silicon with a metal gate is referred to as an HKMG process technology, where HK is an abbreviation for High K, and MG is an abbreviation for the metal gate.

A gate structure of a high-dielectric-constant metal gate MOS transistor uses the HKMG, which includes a high dielectric constant layer (HK) and a metal gate (MG), where the metal gate includes a metal work function layer and a metal conductive material layer, and the metal work function layer is configured to adjust threshold voltages of devices. When the metal work function layer has different work functions, flat-band voltages of the devices are also different, and finally the threshold voltages of the devices are different. Generally, when a gate structure of a peripheral region is formed, the HKMG of an NMOS device and the HKGM of a PMOS device are generally formed simultaneously to simplify processes. Because film layer structures of an initial gate structure of the PMOS device are more than film layer structures of an initial gate structure of the NMOS device, a series of technical problems occur in an etching process, such as a footing defect problem or a necking phenomenon.

SUMMARY

Embodiments of the present disclosure provide a semiconductor structure and a method for fabricating the same.

According to some embodiments of the present disclosure, an aspect of the embodiments of the present disclosure provides a method for fabricating a semiconductor structure. The method includes: providing a substrate including a first type region and a second type region; a first insulation layer and a first initial gate structure being provided on the substrate of the first type region, and a second insulation layer and a second initial gate structure being provided on the substrate of the second type region; and simultaneously etching the first initial gate structure and the second initial gate structure multiple times to form a first gate structure and a second gate structure, where an orthographic projection of a bottom of the first gate structure on the substrate is positioned in an orthographic projection of a top of the first gate structure on the substrate. After a first etching process, a top surface of the first insulation layer positioned in the first type region is not exposed to outside.

According to some embodiments of the present disclosure, another aspect of the embodiments of the present disclosure further provides a semiconductor structure, including: a substrate, where the substrate includes a first type region and a second type region; a first insulation layer and a second insulation layer, where the first insulation layer is positioned on the substrate of the first type region, and the second insulation layer is positioned on the substrate of the second type region; a first gate structure positioned on the first insulation layer of the first type region; and a second gate structure positioned on the second insulation layer of the second type region.

BRIEF DESCRIPTION OF THE DRAWINGS

Exemplary descriptions are made to one or more embodiments with reference to pictures in the corresponding drawings, and these exemplary descriptions do not constitute limitations on the embodiments. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

As can be known from the background art, when HKMG of an NMOS device and HKGM of a PMOS device are simultaneously formed in the prior art, the HKMG of the PMOS device may have a footing defect problem.

Figure 1:
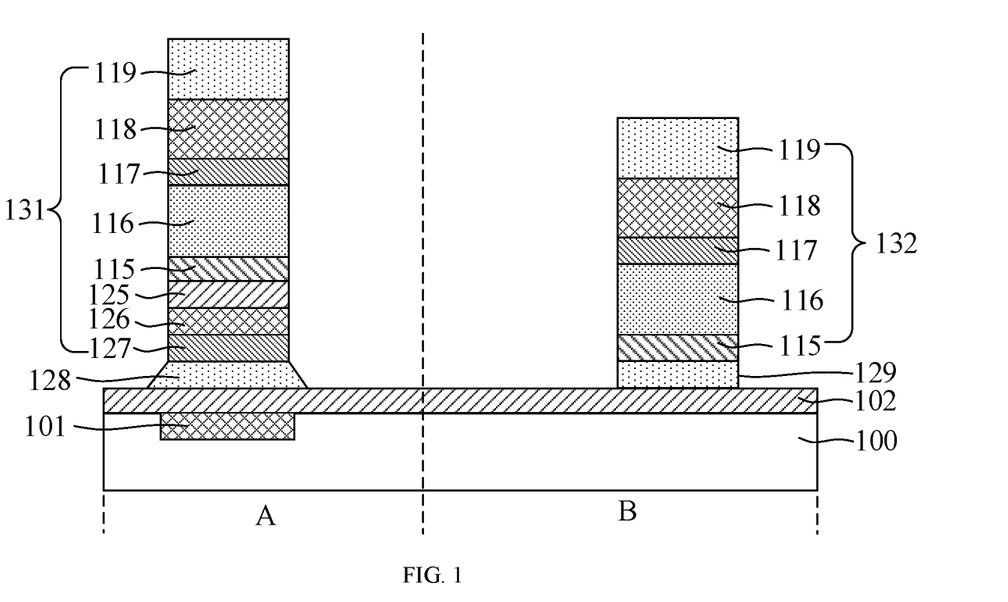
FIG. 1 is a schematic structural diagram of a semiconductor structure.

Based on analysis, it is found that one of the reasons for the foot defect problem in the HKMG of the PMOS device is as below. FIG. 1 is a schematic structural diagram of a semiconductor structure. Referring to FIG. 1, the semiconductor structure includes: a substrate 100, where the substrate 100 includes a first type region A and a second type region B; a first gate dielectric layer 128 and a second gate dielectric layer 129, where the first gate dielectric layer 128 is positioned on the substrate 100 of the first type region A, and the second gate dielectric layer 129 is positioned on the substrate 100 of the second type region B; a first gate structure 131 positioned on the first gate dielectric layer 128 of the first type region A; and a second gate structure 132 positioned on the second gate dielectric layer 129 of the second type region B. The first type region A is configured to form the PMOS device, and the second type region B is configured to form the NMOS device. Because the first gate structure 131 of the first type region A has a first work function layer 126 and a second work function layer 115, and the second gate structure 132 has a second work function layer 115, during the process of simultaneously etching film layers to form the first gate structure 131 and the second gate structure 132, a side surface of the first work function layer 126 formed has a footing effect. Thus, during the process of continuing forming the first gate dielectric layer 128 and the second gate dielectric layer 129, the first gate dielectric layer 128 also has the footing effect. Generally, the footing effect can be eliminated by increasing etching time or increasing a bias voltage. However, increasing the etching time and the bias voltage may cause damage to the second gate structure 132, causing a side surface of the second gate structure 132 to be etched, thereby adversely affecting performance of the second gate structure 132.

Embodiments of the present disclosure provide a method for fabricating a semiconductor structure. In a process of etching both a first initial gate structure and a second initial gate structure multiple times, after etching is performed for the first time, a top surface of a first insulation layer is not exposed, and an orthographic projection of a bottom of the first gate structure on the substrate is positioned within an orthographic projection of a top of the first gate structure on the substrate. That is, a bottom of the first gate structure has no footing defect problem. When the first insulation layer and a second insulation layer are subsequently etched to form a high-dielectric gate dielectric, the first gate dielectric layer at the bottom of the first gate structure has no footing defect problem. In addition, the first gate structure and the second gate structure are formed simultaneously, which may reduce number of masks required to respectively fabricate the first gate structure and the second gate structure, thereby saving process costs and increasing a production rate, such that product competitiveness can be improved.

The footing effect of the first work function layer may be solved by means of a wet etching process without adversely affecting a side wall of the second gate structure. An orthographic projection of the formed first work function layer on the substrate is positioned within an orthographic projection of a first conductive layer on the substrate, such that a side surface of the first gate dielectric layer subsequently formed is flush with that of the first gate structure. That is, there is no footing defect problem. In this way, problems such as a short-circuit risk of adjacent gate structures and leakage current caused by the footing defect problem can be avoided.

The embodiments of the present disclosure will be described in detail below in conjunction with the accompanying drawings. However, a person of ordinary skill in the art may understand that in the embodiments of the present disclosure, many technical details are put forward such that a reader can better understand the present disclosure. However, the technical solutions requested to be protected by the present disclosure may also be implemented even without these technical details or various variations and modifications based on the following embodiments.

FIGS. 2 to 6 are schematic structural diagrams corresponding to steps of a method for fabricating a semiconductor structure according to an embodiment of the present disclosure.

According to some embodiments of the present disclosure, referring to FIGS. 2 to 6, an aspect of the embodiments of the present disclosure provides a method for fabricating a semiconductor structure. The method includes: providing a substrate 200 including a first type region A and a second type region B; a first insulation layer and a first initial gate structure being provided on the substrate 200 of the first type region A, and a second insulation layer and a second initial gate structure being provided on the substrate 200 of the second type region B; and simultaneously etching the first initial gate structure and the second initial gate structure multiple times to form a first gate structure 231 and a second gate structure 232, where an orthographic projection of a bottom of the first gate structure 231 on the substrate 200 is positioned in an orthographic projection of a top of the first gate structure 231 on the substrate 200. After a first etching process, a top surface of the first insulation layer positioned in the first type region A is not exposed to outside.

A process of forming a metal gate of a semiconductor structure includes a gate-first process technology (also referred to as metal inserted poly-Si (MIPS)) or a gate-last process technology (also referred to as replacement metal gate (RMG)). A metal inserted gate process technology means inserting a high-melting-point metal TiN layer and different work function layers between a high-K dielectric material and a polysilicon gate, and the work function layer is referred to as a "cap layer". A purpose of inserting the high-melting-point metal is to solve depletion of the polysilicon gate in the metal inserted gate process, and inserting the work function cap layer may solve a pinning phenomenon at a Fermi level. In some embodiments, the metal gate is formed by means of a metal inserted polysilicon process. In some other embodiments, the metal gate is formed by means of the gate-last process technology. In the gate-last process technology, a dummy poly silicon needs to be used, a formation region of a gate structure is defined by using the dummy poly silicon, and is then self-aligned to form a spacer and a source/drain region. Next, after a first interlayer film is formed, the first interlayer film is generally planarized to expose a surface of the dummy poly silicon. Next the dummy poly silicon is removed and a trench is formed in a region from which the dummy poly silicon is removed. Next an HKMG is formed in the trench. When a process of depositing a gate-first dielectric layer is used, the gate dielectric layer may be formed before the dummy poly silicon is deposited, such that after the trench is formed, the gate dielectric layer is formed at a bottom of the trench. Therefore, it is only necessary to fill the trench with a metal gate. If a process of depositing a gate-last dielectric layer is used, the gate dielectric layer may be replaced with a dummy gate dielectric layer before the dummy poly silicon is deposited. A gate oxide layer is generally used as the dummy gate dielectric layer. In this way, after the trench is formed, the dummy gate dielectric layer at the bottom of the trench needs to be removed, and then the gate dielectric layer and the metal gate are formed in the trench.

Figure 2:
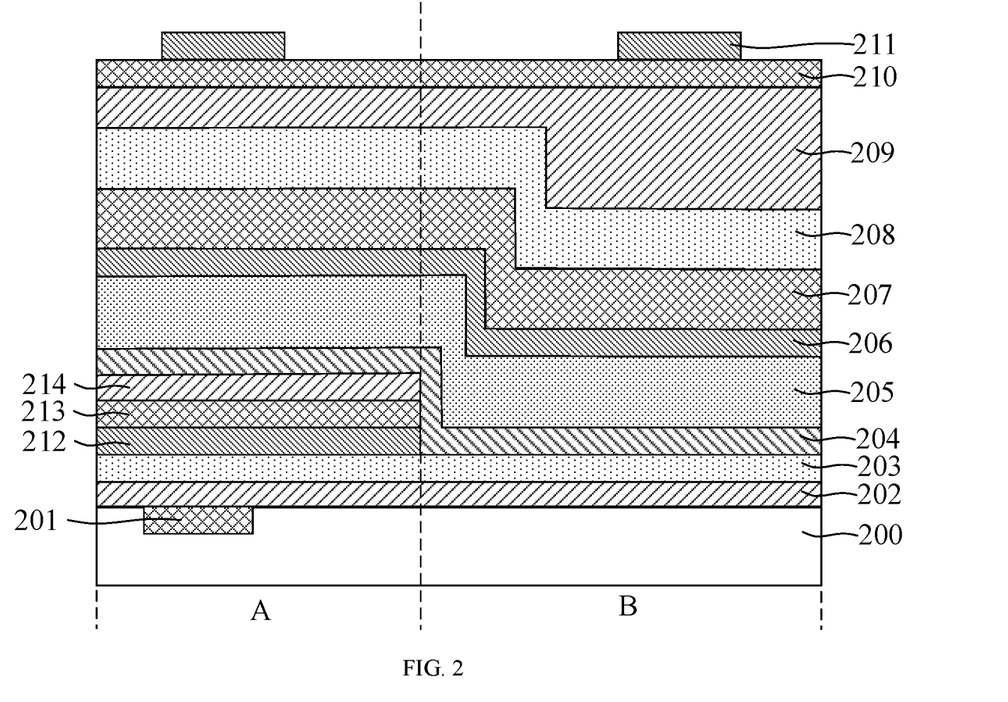
FIGS. 2 to 6 are schematic structural diagrams corresponding to steps of a method for fabricating a semiconductor structure according to an embodiment of the present disclosure.

In some embodiments, referring to FIG. 2, the substrate 200 is a semiconductor substrate, and a material of the semiconductor substrate may be any one of silicon, germanium, silicon carbide, or silicon germanium. The first type region A is a P-type substrate with P-type doping elements, the second type region B is an N-type substrate with N-type doping elements, and a shallow trench isolation structure (not shown) is provided between the first type region A and the second type region B. In some embodiments, the N-type doping element may be a Group-V element such as phosphorus (P) element, bismuth (Bi) element, antimony (Sb) element or arsenic (As) element, and the P-type doping element may be a Group-III element such as boron (B) element, aluminum (Al) element, gallium (Ga) element or indium (In) element.

As shown in FIG. 2, a channel layer 201 is arranged in a substrate 200 of a first type region A, the channel layer 201 may be used as a channel region of a semiconductor structure, a material of the channel layer 201 is silicon germanium, and germanium has high load carrier mobility. In addition, a lattice constant of silicon germanium is greater than that of silicon. Due to a difference between the lattice constants, the substrate 200 generates compressive stress towards a direction of the channel layer 201, thereby increasing mobility of carriers (electrons or holes) in the channel layer 201, and increasing a drive current and a speed of a transistor comprising an active area, the channel layer 201, and a first gate structure. Increase in the mobility may offset decrease in mobility caused by a vertical electric field generated by means of formation of a plurality of transistors on a surface perpendicular to the substrate 200. That is, the semiconductor structure may be converted from 2D to 3D, which is advantageous to increasing storage density of the semiconductor structure. In some other embodiments, the material of the channel layer may be silicon, and the mobility of electrons may be increased by injecting germanium ions into the channel layer. In still other embodiments, the material of the channel layer may be germanium, and germanium has the high carrier mobility.

As shown in FIG. 2, an interface layer 202 is formed on the surface of the substrate 200, and the interface layer 202 is used as a transition layer between the substrate 200 and a gate dielectric layer with a high-K dielectric material, such that an ideal interface between silicon dioxide and silicon may be obtained. In this way, an interface state between the high-K dielectric material and the substrate 200 may be effectively improved, and impacts (for example, scattering of carriers and phonons) of vibration of dipoles inside the high-K dielectric material on the carrier mobility may also be reduced, thereby increasing the carrier mobility. The interface layer 202 is formed by means of an in situ steam generation (ISSG) process, and a material of the interface layer 202 may be silicon dioxide or silicon oxynitride.

In some embodiments, a dielectric film 203 is formed on a surface of the interface layer 202, the dielectric film 203 positioned in the first type region A is used as the first insulation layer, and the dielectric film 203 positioned in the second type region B is used as the second insulation layer. The dielectric film 203 is formed by means of a metal organic chemical vapor deposition (MOCVD) process, a material of the dielectric film 203 may be hafnium silicate $HfSiO_x$, and impacts of a gate voltage on the active area may be reduced by using a high dielectric constant of the hafnium silicate, thereby reducing an effect of a gate-induced leakage current. In some other embodiments, the formed hafnium silicate is subjected to high temperature nitridation, thereby forming hafnium silicon oxynitride HfSiON. The hafnium silicon oxynitride has better high temperature stability. In yet other embodiments, the material of the dielectric film may be silicon dioxide ($SiO_2$), silicon nitride ($Si_3N_4$), aluminum oxide ($Al_2O_3$), tantalum pentoxide ($Ta_2O_5$), yttrium oxide ($Y_2O_3$), hafnium silicate oxide compound ($HfSiO_4$), hafnium dioxide ($HfO_2$), lanthanum oxide ($La_2O_3$), zirconium dioxide ($ZrO_2$), strontium titanate ($SrTiO_3$) or zirconium silicate oxide ($ZrSiO_4$), etc.

In some embodiments, a protective film 212, a first work function film 213 and a barrier film 214 stacked are formed on a surface of the dielectric film 203, where the protective film 212 is configured to protect the dielectric film 203, and a material of the protective film 212 is titanium nitride or other metal nitride. A thickness of the barrier film 214 is 5 nm to 10 nm, a material of the barrier film 214 is titanium nitride or other metal nitride, and the barrier film 214 is configured to solve a problem of depletion of gate polysilicon. The barrier film is formed between the first work function film and a second work function film, to prevent a material of a metal gate at a top or a material of the second work function film from penetrating down to the first work function film and adversely affecting the first work function layer, such that the performance of the PMOS device can be stabilized. The first work function film 213 is a work function layer of the PMOS device, a material of the first work function film 213 is aluminum oxide $AlO_y$, and a work function of a P-type metal work function layer generally depletes a top of a valence band of a semiconductor substrate such as a silicon substrate, such that an absolute value of a threshold voltage of the PMOS device becomes smaller, which is advantageous to increasing speed of the device and reducing power consumption. The protective film 212 (a titanium nitride film) can prevent Al from piercing downward.

In some embodiments, the protective film 212, the first work function film 213 and the barrier film 214 of the second type region B are removed, to expose the second insulation layer. A second work function film 204, a second barrier film 205, a semiconductor film 206, a conductive film 207 and a dielectric film 208 are formed on the barrier film 214 of the first type region A and a surface of the second insulation layer. The second work function film 204 is an N-type metal work function layer. A work function of the N-type metal work function layer generally depletes a bottom of a conduction band of a semiconductor substrate such as a silicon substrate, such that a threshold voltage of an NMOS device can be reduced, which is advantageous to increasing the speed of the device and reducing the power consumption. A material of the second work function film 204 is lanthanum oxide $LaO_m$. A material of the second barrier film 205 is titanium nitride or other metal nitride, and the second barrier film 205 is configured to prevent metal in the conductive film 207 from diffusing into the second work function film 204. The second barrier film 205 may be amorphous titanium nitride, and the second barrier film 205 is set to be an amorphous structure. Compared with a polycrystalline structure, the amorphous structure has no grain boundary that is the same as a grain boundary in the polycrystalline structure that penetrates through a thickness of the entire polycrystalline structure. Therefore, an oxygen diffusion path generated due to the grain boundary is not formed. That is, an oxygen diffusion path can be reduced or eliminated. In this way, by reducing or completely preventing oxygen from diffusing to a surface of the metal work function layer, the surface of the metal work function layer can be prevented from being oxidized. By reducing or eliminating a surface oxidation structure of the metal work function layer, the surface oxidation structure of the metal work function layer is changed to a less-oxide or non-oxide structure. In this way, a shift to a work function can be prevented after the surface of the metal work function layer is oxidized, thereby preventing a threshold voltage of the device from drifting. The semiconductor film 206 is polysilicon. A material of the conductive film 207 may be tungsten. Polysilicon is replaced with metal as a device gate material. Replacing a polysilicon gate with a metal gate can improve a pinning phenomenon at a Fermi level. In addition, the metal gate has higher electron density, such that a problem of depletion of the polysilicon gate may be effectively solved. There may be a third barrier film between the semiconductor film 206 and the conductive film 207, the third barrier film is configured to block metal of the conductive film 207 from diffusing into the semiconductor film 206, and a material of the third barrier film may be silicon nitride or silicon nitride. The dielectric film 208 is a top cap layer, and a material of the dielectric film 208 is silicon nitride, silicon oxide or silicon oxynitride.

In some embodiments, the first initial gate structure includes the first work function film 213, the second work function film 204 and the conductive film 207 stacked, and the second initial gate structure includes the second work function film 204 and the conductive film 207. A first mask 209 and a second mask 210 are formed on the top surface of the dielectric film 208; a photoresist layer 211 is formed on a top surface of the second mask 210.

In some embodiments, a first mask 209 is a spin-coated hard mask layer, and a top surface of the first mask 209 shown in FIG. 2 may be flushed by means of a chemical polishing process (CMP). A material of a second mask 210 is silicon oxynitride or amorphous silicon. The material of the second mask 210 has great strength and may be configured to protect the dielectric film 208, to prevent a top surface of the dielectric film 208 from being damaged during an etching process. The second mask 210 may also control the patterning precision for forming the first gate structure and the second gate structure. In some other embodiments, a top surface of the first mask of the first type region A is higher than a top surface of the first mask of the second type region B. That is, a thickness of the first mask of the first type region A is equal to that of the first mask of the second type region B.

Figure 3:
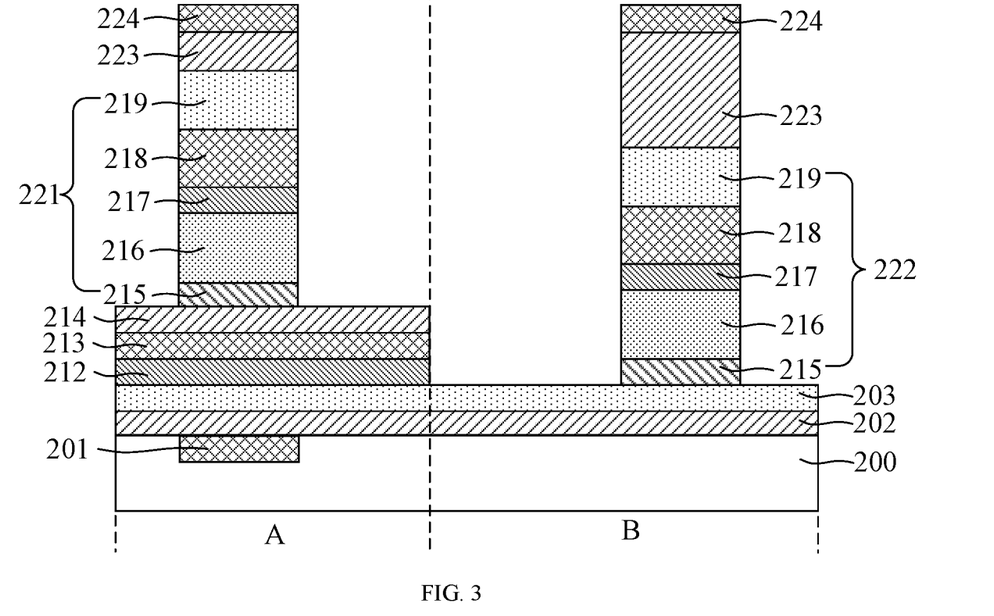

Referring to FIG. 3, while etching the conductive film 207 and the second work function film 204 that are positioned on the substrate 100 of the first type region A to form first conductive layers 221 arranged at intervals, the conductive film 207 and the second work function film 204 that are positioned on the substrate 100 of the second type region B are etched to form second conductive layers 222 arranged at intervals.

In some embodiments, the first conductive layer 221 and the second conductive layer 222 are formed by means of a dry etching process, the first initial gate structure and the second initial gate structure are exposed by means of the photoresist layer 211, and then exposed film layers of the first initial gate structure and the second initial gate structure are etched. The first mask layer 223 is formed by etching the first mask 209, and the second mask layer 224 is formed by etching the second mask 210.

Figure 4:
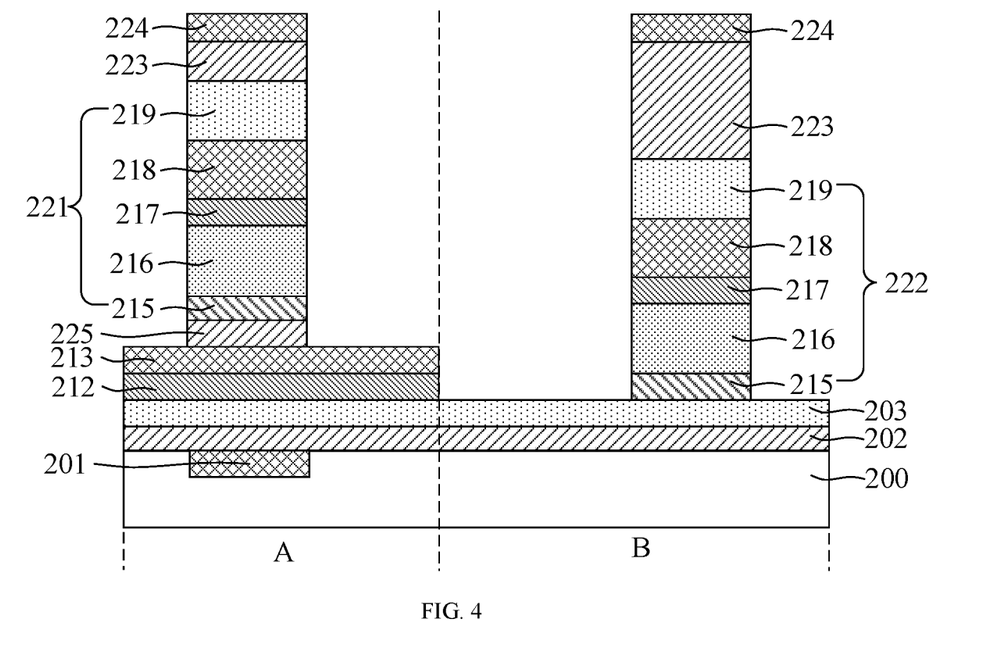

Referring to FIGS. 3 to 4, the barrier film 214 is etched to form a barrier layer 225, and an orthographic projection of the barrier layer 225 on the substrate 200 is positioned within the orthographic projection of the first conductive layer 221 on the substrate 200.

In some embodiments, the barrier film 214 is etched by means of a second wet etching process. Based on the etching selectivity of the wet etching process, only a material of a barrier layer 225 may be etched without causing damage to another film layer. In this way, the structural stability of the film layers of the first gate structure and the second gate structure may be ensured to a greatest extent. By means of the second wet etching process, a footing effect of the barrier layer 225 may be solved without adversely affecting a side wall of the second gate structure. An orthographic projection of the formed barrier layer 225 on a substrate 220 is positioned within the orthographic projection of the first conductive layer 221 on the substrate 200, such that a side surface of a first gate dielectric layer subsequently formed is flush with that of the first gate structure. That is, there is no footing defect problem. In this way, problems such as a short-circuit risk of adjacent gate structures and leakage current caused by the footing defect problem can be avoided.

In some embodiments, an etching solution of the second wet etching process is a mixed solution of sulfuric acid and hydrogen peroxide (SPM solution). A mass ratio of sulfuric acid to hydrogen peroxide is 33:1. An etching rate of nitrogen is controlled by changing a ratio of sulfuric acid to hydrogen peroxide in a mixed solution. By increasing a content of the hydrogen peroxide, an oxidation reaction on a nitrogen surface may be activated, thereby increasing an etching rate of silicon nitride.

In some embodiments, etching time of the second wet etching process is 5 s to 20 s. In some embodiments, the etching time of the second wet etching process is 5 s to 15 s. For example, the etching time of the second wet etching process may be 5.3 s, 6.8 s, 9.1 s, or 14.8 s. If the etching time of the second wet etching process is too long, the barrier film 214 is etched away excessively. Consequently, a necking phenomenon may be caused, such that a bottom support layer of the first gate structure does not have enough support force, thereby causing tilting or even cracking of the first gate structure. However, if the etching time of the second wet etching process is too short, protruding footing at an end of the barrier layer 225 is not solved. Consequently, there exists footing in the first gate dielectric layer subsequently formed.

Figure 5:
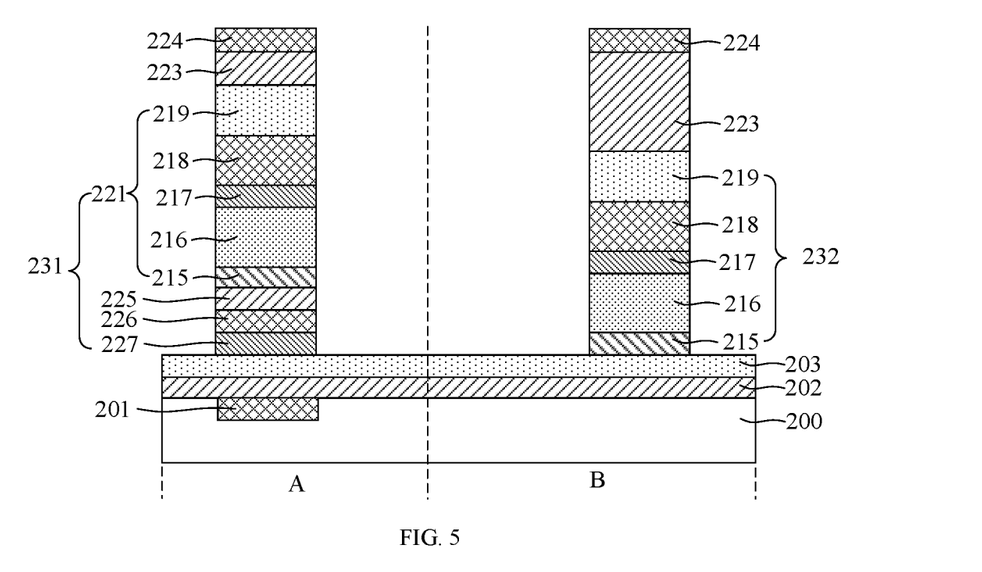
Figure 6:
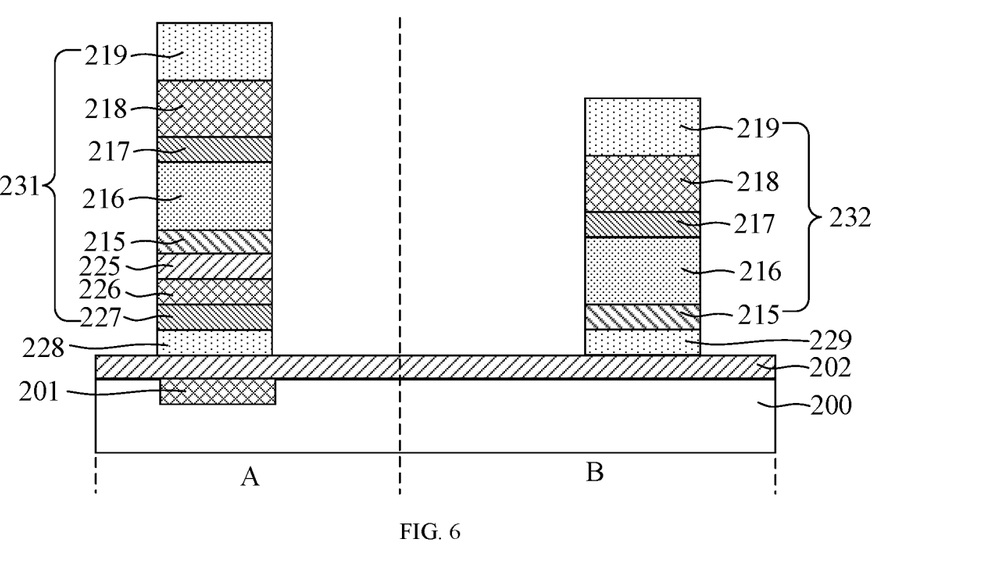

Referring to FIGS. 4 to 6, the first work function film 213 is etched by means of a first wet etching process to form a first work function layer 226, where an orthographic projection of the first work function layer 226 on the substrate 200 is positioned within an orthographic projection of the first conductive layer 221 on the substrate 200. The barrier layer 225, the first work function layer 226 and the first conductive layer 221 together form the first gate structure 231, and the second conductive layer 222 serves as the second gate structure 232. The footing effect of the first work function layer 226 may be solved by means of a first wet etching process without adversely affecting a side wall of a second gate structure. An orthographic projection of the formed first work function layer 226 on the substrate 200 is positioned within the orthographic projection of the first conductive layer 221 on the substrate 200, such that a side surface of a first gate dielectric layer subsequently formed is flush with that of the first gate structure 231. That is, there is no footing defect problem. In this way, problems such as a short-circuit risk of adjacent gate structures and leakage current caused by the footing defect problem can be avoided.

In some embodiments, an etching solution of the first wet etching process is hydrochloric acid solution. The concentration of the hydrochloric acid solution is 200:1.

In some embodiments, etching time of the first wet etching process is 50 s to 70 s. In some embodiments, the etching time of the first wet etching process is 50 s to 60 s. For example, the etching time of the first wet etching process may be 52 s, 54 s, 56 s, or 59 s. If the etching time of the first wet etching process is too long, the first work function films 213 is etched away excessively. Consequently, a necking phenomenon may be caused, such that a bottom support layer of the first gate structure does not have enough support force, thereby causing tilting or even cracking of the first gate structure. However, if the etching time of the first wet etching process is too short, protruding footing at an end of the first work function layer 226 is not solved. Consequently, there exists footing in the first gate dielectric layer subsequently formed.

In some embodiments, a pitch between the side surface of the first work function layer 226 and the side surface of the first conductive layer 221 is less than or equal to 1.5 nm, and degree of necking is controlled by controlling etching process parameters to avoid tilting or even cracking of the first gate structure.

In some embodiments, referring to FIG. 5, a protective layer 227 is formed by etching the protective film 212. The protective layer 227 is formed by means of a wet etching process, and an etching solution of the wet etching process is a mixed solution of the sulfuric acid and the hydrogen peroxide (an SPM solution).

In some embodiments, the barrier film 214 and the first work function film 213 are alternately etched, until both the orthographic projection of the first work function layer 226 on the substrate 200 and the orthographic projection of the barrier layer 225 on the substrate 200 are positioned within the orthographic projection of the first conductive layer 221 on the substrate 200. The barrier film 214 and the first work function film 213 are etched multiple times, such that shapes and appearances of the barrier layer 225 and the first work function layer 226 may be controlled more precisely, thereby avoiding waste of the etching solution and reducing costs. In addition, the footing effect and the necking phenomenon may be avoided.

Referring to FIG. 6, after etching the first initial gate structure, the method further includes: while etching the first insulation layer to form the first gate dielectric layer 228, simultaneously etching the second insulation layer to form a second gate dielectric layer 229. The first gate dielectric layer 228 and the second gate dielectric layer 229 are formed by means of a dry etching process; and then the first mask layer 223 and the second mask layer 224 are removed.

In the technical solutions provided by the embodiments of the present disclosure, in a process of simultaneously etching both the first initial gate structure and the second initial gate structure multiple times, the top surface of the first insulation layer is not exposed after the first etching is completed, and the orthographic projection of the bottom of the first gate structure 231 on the substrate 200 is positioned within the orthographic projection of the top of the first gate structure 231 on the substrate 200. That is, the bottom of the first gate structure 231 has no footing defect problem. When the first insulation layer and the second insulation layer are subsequently etched to form a high-dielectric-constant gate dielectric, the first gate dielectric layer at the bottom of the first gate structure 231 has no footing defect problem. In addition, the first gate structure 231 and the second gate structure 232 are formed simultaneously, which may reduce number of masks required to respectively fabricate the first gate structure 231 and the second gate structure 232, thereby saving process costs and increasing a production rate, such that product competitiveness can be improved.

Correspondingly, according to some embodiments of the present disclosure, yet another aspect of the embodiments of the present disclosure further provides a semiconductor structure, which is fabricated by means of the method for fabricating a semiconductor structure provided by the above-mentioned embodiments. The same or corresponding elements as those of the above-mentioned embodiments are not described in detail.

Referring to FIG. 5, the semiconductor structure includes: a substrate 200, where the substrate 200 includes a first type region A and a second type region B; a first insulation layer and a second insulation layer, where the first insulation layer is positioned on the substrate 200 of the first type region A, and the second insulation layer is positioned on the substrate 200 of the second type region B; a first gate structure 231 positioned on the first insulation layer of the first type region A; and a second gate structure 232 positioned on the second insulation layer of the second type region B.

In some embodiments, the first insulation layer and the second insulation layer constitute a continuous dielectric film 203, where the first insulation layer is configured to subsequently form the first gate dielectric layer, and the second insulation layer is configured to subsequently form the second gate dielectric layer. In some other embodiments, the first insulation layer is a first gate dielectric layer, and the second insulation layer is a second gate dielectric layer. An orthographic projection of the first gate structure on the surface of the first insulation layer is positioned within the first insulation layer, and an orthographic projection of the second gate structure on the surface of the second insulation layer is positioned within the second insulation layer.

In some embodiments, the first gate structure 231 includes a first work function layer 226 and a first conductive layer 221 stacked, where an orthographic projection of the first work function layer 226 on the substrate 200 is positioned within an orthographic projection of the first conductive layer 221 on the substrate 220, and the second gate structure 232 includes a second conductive layer. A pitch between the side surface of the first work function layer 226 and the side surface of the first conductive layer 221 is less than or equal to 1.5 nm, and degree of necking is controlled by controlling etching process parameters to avoid tilting or even cracking of the first gate structure.

In some embodiments, the first gate structure 231 further includes: a barrier layer 225 positioned between the first work function layer 226 and the first conductive layer 221; and a protective layer 227 positioned between the first work function layer 226 and the first insulation layer.

Those of ordinary skill in the art can understand that the above-mentioned embodiments are some embodiments for realizing the present disclosure, but in practical applications, various changes may be made to them in form and details without departing from the spirit and scope of the present disclosure. Any person skilled in the art can make their own changes and modifications without departing from the spirit and scope of the present disclosure. Therefore, the protection scope of the present disclosure shall be subject to the scope defined by the claims.

What is claimed is:

1. A method for fabricating a semiconductor structure, comprising:
   providing a substrate comprising a first type region and a second type region,
   wherein a first insulation layer and a first initial gate structure are provided on the substrate of the first type region, and a second insulation layer and a second initial gate structure are provided on the substrate of the second type region; and
   simultaneously etching the first initial gate structure and the second initial gate structure multiple times to form a first gate structure and a second gate structure, an orthographic projection of a bottom of the first gate structure on the substrate being positioned in an orthographic projection of a top of the first gate structure on the substrate, wherein
   after a first etching process, a top surface of the first insulation layer positioned in the first type region is not exposed to outside;
   wherein the first initial gate structure comprises a first work function film, a second work function film, and a conductive film stacked, the second initial gate structure comprising the second work function film and the conductive film;

the simultaneously etching the first initial gate structure and the second initial gate structure multiple times comprises:

while etching the conductive film and the second work function film that are positioned on the substrate of the first type region to form a first conductive layer, etching the conductive film and the second work function film that are positioned on the substrate of the second type region to form a second conductive layer; and etching the first work function film by means of a first wet etching process to form a first work function layer, wherein an orthographic projection of the first work function layer on the substrate is positioned within an orthographic projection of the first conductive layer on the substrate, the first work function layer and the first conductive layer together constitute the first gate structure, and the second conductive layer serves as the second gate structure;

wherein the first conductive layer and the second conductive layer are formed by means of a dry etching process; and an etching solution of the first wet etching process is hydrochloric acid solution, and etching time of the first wet etching process is 50s to 70s;

wherein before forming the second work function film, the method further comprises: forming a barrier film on the first work function film; and before etching the first work function film, the method further comprises: etching the barrier film to form a barrier layer, wherein an orthographic projection of the barrier layer on the substrate is positioned within the orthographic projection of the first conductive layer on the substrate, and the barrier layer, the first work function layer and the first conductive layer together constitute the first gate structure;

wherein the barrier film and the first work function film are alternately etched, until both the orthographic projection of the first work function layer on the substrate and the orthographic projection of the barrier layer on the substrate are positioned within the orthographic projection of the first conductive layer on the substrate.

2. The method for fabricating the semiconductor structure according to claim 1, wherein a concentration of the hydrochloric acid solution is 200:1.

3. The method for fabricating the semiconductor structure according to claim 1, wherein the barrier film is etched by means of a second wet etching process, and an etching solution of the second wet etching process is a mixed solution of sulfuric acid and hydrogen peroxide.

4. The method for fabricating the semiconductor structure according to claim 3, wherein a mass ratio of the sulfuric acid to the hydrogen peroxide is 33:1.

5. The method for fabricating the semiconductor structure according to claim 3, wherein etching time of the second wet etching process is 5s to 20s.

6. The method for fabricating the semiconductor structure according to claim 1, wherein the forming the first insulation layer and the second insulation layer comprises: forming a dielectric film on a surface of the substrate, the dielectric film positioned in the first type region being used as the first insulation layer, and the dielectric film positioned in the second type region being used as the second insulation layer; and after etching the first initial gate structure, the method further comprises: while etching the first insulation layer to form a first gate dielectric layer, etching the second insulation layer to form a second gate dielectric layer.

7. The method for fabricating the semiconductor structure according to claim 1, wherein a pitch between a side surface of the first work function layer and a side surface of the first conductive layer is less than or equal to 1.5 nm.

8. A semiconductor structure fabricated by means of the method for fabricating the semiconductor structure according to claim 1, wherein the semiconductor structure comprises:

a substrate comprising a first type region and a second type region;

a first insulation layer and a second insulation layer, wherein the first insulation layer is positioned on the substrate of the first type region, and the second insulation layer is positioned on the substrate of the second type region;

a first gate structure positioned on the first insulation layer of the first type region; and a second gate structure positioned on the second insulation layer of the second type region.

9. The semiconductor structure according to claim 8, wherein the first gate structure comprises a first work function layer and a first conductive layer stacked, an orthographic projection of the first work function layer on the substrate being positioned within an orthographic projection of the first conductive layer on the substrate, and the second gate structure comprising a second conductive layer.

10. The semiconductor structure according to claim 9, wherein the first gate structure further comprises a barrier layer, the barrier layer being positioned between the first work function layer and the first conductive layer.

* * * * *